United States Patent [19]

Dunsche

[11] 3,717,523

[45] Feb. 20, 1973

[54] METHOD OF GAS-TIGHT SEALING OF SEMICONDUCTOR COMPONENTS

[75] Inventor: Horst Georg Dunsche, Singapore 12, Singapore

[73] Assignee: Siemens Aktiengesellschaft, Berlin, Germany

[22] Filed: Aug. 23, 1971

[21] Appl. No.: 173,834

[30] Foreign Application Priority Data

Aug. 26, 1970 Germany....................P 20 42 333.0

[52] U.S. Cl. ........................156/69, 29/589, 29/627, 156/321, 156/322, 264/272

[51] Int. Cl. ..............................................B29c 27/02

[58] Field of Search ........156/69, 322, 321; 264/272; 29/589, 627; 317/234 E

[56] References Cited

UNITED STATES PATENTS 3,474,302 10/1969 Blundell............................317/234 P 3,585,715 6/1971 Bedford..............................29/589 X

*Primary Examiner*—Edward G. Whitby

*Attorney*—Curt M. Avery et al.

[57] ABSTRACT

For a gas-tight sealing of a semiconductor in a metal housing, the housing is preheated. An annular tablet of epoxide resin is then placed on the housing. While the housing slowly cools off, the tablet melts and seals the component by fusion.

6 Claims, 2 Drawing Figures

PATENTED FEB 20 1973 3,717,523

METHOD OF GAS-TIGHT SEALING OF SEMICONDUCTOR COMPONENTS

Figure 1:
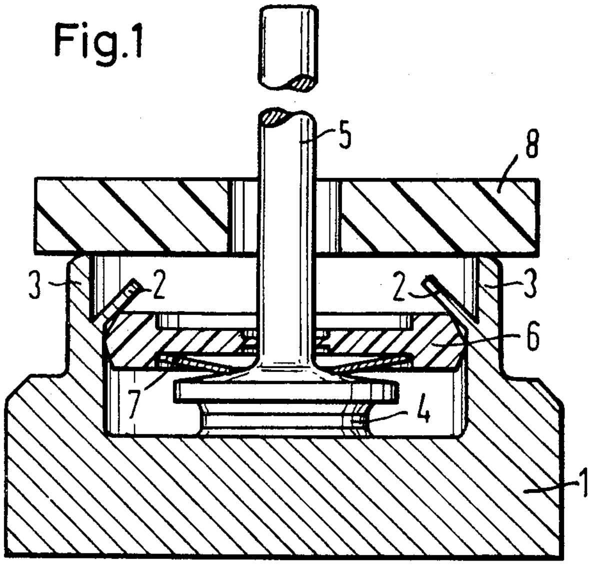

The invention relates to a method of gas-tight sealing of semiconductor components. More particularly, the invention relates to a method of gas-tight sealing of a semiconductor component in a cup-shaped metal housing. The housing functions as an electric lead for a semiconductor system embedded therein and has an open upper portion covered by a cover or lid of insulating material inserted into the open portion. The cover is in pressure contact with the housing. Another electric lead for the semiconductor system is led through the cover.

German Registered Design Pat. No. 6,934,501 discloses a semiconductor component in a cup-shaped metal housing containing the semiconductor system. An insulated cover is installed on the housing by abutment, under pressure. The portion of the housing which protrudes beyond the cover is further sealed gas-tight by a synthetic wrapping.

One embodiment of a method of gas-tight sealing or covering of a housing by a synthetic material is to apply a synthetic wrapping by casting. Such possibilities for partial or complete casting of semiconductor components are known in the semiconductor art.

An object of our invention is to provide a method of gas-tight sealing of a semiconductor component which is particularly simple and economical for the mass production of semiconductor structural components.

To accomplish this and in accordance with the invention, the cup-shaped metal housing is heated and an annular tablet of homogenous synthetic material is placed on the upper rim of the housing. The tablet of synthetic material melts due to the preheating of the housing and fills the portion of the housing projecting beyond the cover by fusion, thereby sealing the housing gas-tight.

In accordance with the invention, a method of gas-tight sealing of a semiconductor component in a cup-shaped metal housing which functions as an electric lead for a semiconductor system housed therein and which has an upper rim and an upper open portion covered by a cover of insulating material in pressure-contact with the housing, the semiconductor system having another electric lead passing through the cover of the housing, comprises heating the housing, and placing a substantially annular tablet of homogenous synthetic material on the upper rim of the housing whereby the tablet melts due to the preheating of the housing and fuses to fill the part of the housing which projects above the cover and seals the housing gas-tight.

The method may further comprise regulating the cooling of the housing.

The tablet may comprise an epoxide resin.

The method may further comprise coating the upper area of the housing up to the cover with a varnish when improves the adherence of the melted synthetic material to the housing.

The method may further comprise hardening the melted synthetic material by heating the housing at 150°C for 1 hour.

The varnish has a base of polyesterimides.

The method of the invention has the considerable advantage that it requires only a slight output of tools and machines, since the synthetic tablet is placed on the preheated housing in a simple manner and clings closely to the upper portion of the housing, on its own, due to fluidization or fusion, during the slow cooling of the housing. The synthetic material thus encloses the upper portion of the housing on all sides in a gas-tight manner.

If, in accordance with another feature of the invention, the cooling of the housing is regulated, the flow rate of the synthetic material may also be adjusted. This permits the melting of thick tablets of synthetic material without causing the synthetic material to drop off or trickle down the structural component.

Figure 2:
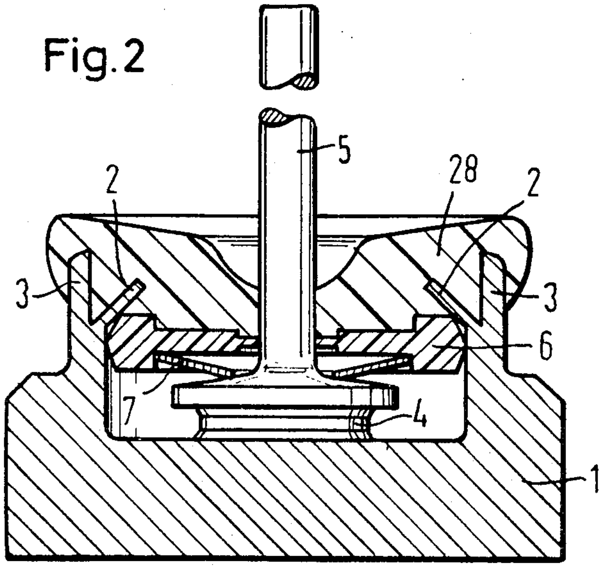

In order that the invention may be readily carried into effect, it will now be described with reference to the accompanying drawing, wherein:

FIG. 1 is a schematic view, partly in section, of a semiconductor component at the beginning of the method of the invention for gas-tight sealing of the component; and FIG. 2 is a schematic diagram, partly in section, of the semiconductor component of FIG. 1 at the completion of the method of the invention for gas-tight sealing of the component.

In the FIGS., the same components are identified by the same reference numerals.

FIG. 1 shows, as an example, a prefabricated semiconductor rectifier having a cup-shaped metal housing 1 for a semiconductor component to be sealed gas-tight. The housing 1 has an open upper rim 3. Claws or prongs 2 split-off from the housing 1 on the inside thereof at its upper rim 3. A semiconductor system 4 is affixed to the inside surface of the bottom of the housing 1 by any suitable means such as, for example, soldering. The housing 1 functions as one of the electric leads for the semiconductor system 4.

The surface of the semiconductor system 4 facing away from the inside surface of the bottom of the housing is affixed to another electric lead 5 by any suitable means such as, for example, soldering. A cover or lid 6 of insulating material is placed in the upper part of the housing 1 in the opening thereof. The cover 6 is held down by the claws or prongs 2.

The lead 5 is led insulated through the cover 6. The surface of the cover 6 which faces the semiconductor system 4 is provided with a spring 7 which is kept under tension by said cover, thereby exerting a contact pressure against the lead 5.

In order to seal the thus prefabricated semiconductor component gas-tight with a synthetic material in accordance with the invention, the housing 1 is first preheated to a specific temperature. Thereafter, an annular tablet or ring 8 of synthetic material is placed on the upper rim of the housing 1. The synthetic material 8 is preferably an epoxide resin which has a good thermal resistance or stability, even when there are rapid temperature changes, for example, within a range of about −40° to +150°C.

The temperature to which the housing 1 of the semiconductor component is heated must be sufficiently high to melt the tablet 8 of synthetic material. This generally depends upon the type of tablet and structural component. While the component cools slowly, the melting synthetic material 8 undergoes fluidization or fusion, and results in a synthetic covering 28, as illustrated in FIG. 2.

Of special advantage during the melting process is a regulated cooling of the semiconductor component which permits the adjustment of, the flow rate of the synthetic material. Thick tablets of synthetic material may be melted in this manner without causing the synthetic material to trickle down the component. Furthermore, the regulated cooling of the housing 1 of the semiconductor component assures that the synthetic material 8 will not penetrate to the region of said component containing the semiconductor system 4.

To obtain a particularly good adherence of the mass of synthetic material 8 to the metal housing 1, the upper region of said housing is brushed up to its cover 6, prior to the placing of said synthetic material, with a viscous varnish on a base of polyesterimides.

According to another feature of the invention, the melting process may be following by a hardening of the mass of synthetic material 8, during which the semiconductor component is subjected to a temperature of 150°C for 1 hour. At such a temperature, the resin is already so solid that subsequent penetration into the inside area of the housing 1 is no longer possible.

While the invention has been described by means of a specific example and in a specific embodiment, we do not wish to be limited thereto, for obvious modifications will occur to those skilled in the art without departing from the spirit and scope of the invention.

We claim:

1. A method of gas-tight sealing of a semiconductor component in a cup-shaped metal housing which functions as an electric lead for a semiconductor system housed therein and which has an upper rim and an upper open portion covered by a cover of insulating material in pressure-contact with the housing, the semiconductor system having another electric lead passing through the cover of the housing, said method comprising heating the housing; and placing a substantially annular tablet of homogenous synthetic material on the upper rim of the housing whereby the tablet melts due to the preheating of the housing and fuses to fill the part of the housing which projects above the cover and seals the housing gas-tight.

2. A method of gas-tight sealing as claimed in claim 1, further comprising regulating the cooling of the housing.

3. A method of gas-tight sealing as claimed in claim 1, wherein the tablet comprises an epoxide resin.

4. A method of gas-tight sealing as claimed in claim 1, further comprising coating the upper area of the housing up to the cover with a varnish which improves the adherence of the melted synthetic material to the housing.

5. A method of gas-tight sealing as claimed in claim 1, further comprising hardening the melted synthetic material by heating the housing at 150°C for 1 hour.

6. A method of gas-tight sealing as claimed in claim 4, wherein the varnish has a base of polyesterimides.

* * * * *